US 6,656,826 B2

(12) United States Patent
Ishimaru (10) Patent No.: US 6,656,826 B2
(45) Date of Patent: Dec. 2, 2003

(54) SEMICONDUCTOR DEVICE WITH FUSE TO BE BLOWN WITH ENERGY BEAM AND METHOD OF MANUFACTURING THE SEMICONDUCTOR DEVICE

(75) Inventor: Kazunari Ishimaru, Kanagawa-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 09/963,430

(22) Filed: Sep. 27, 2001

(65) Prior Publication Data

US 2002/0037643 A1 Mar. 28, 2002

(30) Foreign Application Priority Data

Sep. 27, 2000 (JP) ........................................ 2000-293941

(51) Int. Cl.[7] .......................... H01L 21/44; H01L 29/00
(52) U.S. Cl. ...................... 438/612; 438/601; 438/618; 438/642; 438/648; 438/687; 438/613; 438/128; 438/129; 438/132; 438/215; 438/281; 438/333; 257/355; 257/532; 257/529; 257/209; 257/750; 257/762; 29/623; 327/525
(58) Field of Search ................ 438/612, 601, 438/642, 648, 618, 687, 613, 128, 129, 132, 215, 281, 333; 257/529, 209, 355, 750, 762, 532; 29/623; 327/525

(56) References Cited

U.S. PATENT DOCUMENTS 6,033,939 A * 3/2000 Agarwala et al. ............ 438/132
6,249,038 B1 * 6/2001 Daubenspeck et al. ...... 257/529
6,259,146 B1 * 7/2001 Giust et al. .................. 257/529
6,261,873 B1 * 7/2001 Bouldin et al. ............. 438/132
6,295,721 B1 * 10/2001 Tsai ............................. 29/623
6,413,848 B1 * 7/2002 Giust et al. .................. 438/601
6,440,834 B2 * 8/2002 Daubenspeck et al. ...... 438/601
6,496,053 B1 * 12/2002 Daubenspeck et al. ...... 327/525

FOREIGN PATENT DOCUMENTS

JP          5-114655       5/1993
JP          11-340265      12/1999
JP          3177968        4/2001

* cited by examiner

Primary Examiner—Matthew Smith
Assistant Examiner—Belur Keshavan
(74) Attorney, Agent, or Firm—Oblon, Spivak, McClelland, Maier & Neustadt, P.C.

(57) ABSTRACT

A semiconductor device has a fuse to be blown with an energy beam. The semiconductor device has copper wiring levels formed on a semiconductor substrate on which semiconductor elements are formed, an uppermost wiring level formed on said copper wiring levels and including a refractory metal film connected to a top one of the copper wiring levels, the fuse formed from a part of the uppermost wiring level, and a surface protective film formed on the uppermost wiring level.

26 Claims, 6 Drawing Sheets

PAD AREA 13
ELEMENT AREA 20
20

FIG.7B

13
ELEMENT AREA 20
20

SEMICONDUCTOR DEVICE WITH FUSE TO BE BLOWN WITH ENERGY BEAM AND METHOD OF MANUFACTURING THE SEMICONDUCTOR DEVICE

CROSS REFERENCE TO RELATED APPLICATIONS

This application is based upon and claims the benefit of priority from the prior Japanese Patent Application No. P2000-293941 filed on Sep. 27, 2000, the entire contents of which are incorporated herein by reference.

BACKGROUND OF THE INVENTION

1. Field of the Invention

The present invention relates to a semiconductor device and a method of manufacturing the semiconductor device. In particular, the present invention relates to a semiconductor device with copper wiring and a fuse that forms part of a redundancy circuit and a method of manufacturing such a semiconductor device. The present invention also relates to a semiconductor device with protrusion electrodes (bumps) for flip-chip packaging and a method of manufacturing such a semiconductor device.

2. Description of the Related Art

Semiconductor integrated circuit devices are improving in functions and capacities through finely thinned elements and multileveled wiring. The fine elements and multileveled wiring tend to cause defects during semiconductor chip manufacturing, to decrease the yield of semiconductor chips. A typical technique, of repairing such defects during semiconductor device manufacturing and improving the yield of semiconductor products, is a redundancy circuit technique. This technique prepares spare elements in a semiconductor chip in advance, and if defective elements are found in the chip, replaces the defective elements with the spare elements, thereby repairing the chip. For example, a column or row of memory cells, containing a defective memory cell in a semiconductor memory, is replaced with spare memory cells. Replacing defective elements with spare elements is carried out by blowing a fuse. The fuse forms a part of the redundancy circuit containing the spare elements. Blowing the fuse is carried out by laser or electricity. The fuse is generally formed from polycrystalline silicon or metal.

In a semiconductor chip packaging field, wireless bonding, that may replace wire bonding, is studied and practiced. An example of the wireless bonding is flip-chip packaging. The flip-chip packaging forms bumps serving as electrodes on the surface of a semiconductor chip, reverses the chip, positions the bumps on electrodes of a circuit board, and connects them together by facedown bonding. In this way, the semiconductor chip is installed on the circuit board. The flip-chip packaging is ideal to reduce the size of a semiconductor package and increase the density of elements in the semiconductor package.

To reduce resistance and improve reliability, recent semiconductor devices frequently employ copper (Cu) wiring instead of aluminum (Al) wiring. To increase scale and density, recent semiconductor devices frequently employ multileveled wiring. For example, high-speed SRAMs employ four-level wiring, and logic LSIs with memories employ wiring of five or more levels. Generally, upper wiring levels are made to be thicker than lower wiring levels, to stabilize a power source voltage.

SUMMARY OF THE INVENTION

An aspect of the present invention provides a semiconductor device having copper wiring levels formed on a semiconductor substrate on which semiconductor elements are formed, an uppermost wiring level formed on the copper wiring levels and including a refractory metal film connected to a top one of the copper wiring levels, a fuse formed from a part of the uppermost wiring level, to be blown with an energy beam, and a surface protective film formed on the uppermost wiring level.

DETAILED DESCRIPTION OF THE INVENTION

Various embodiments of the present invention will be described with reference to the accompanying drawings. It is to be noted that the same or similar reference numerals are applied to the same or similar parts and elements throughout the drawings, and the description of the same or similar parts and elements will be omitted or simplified.

Figure 1:
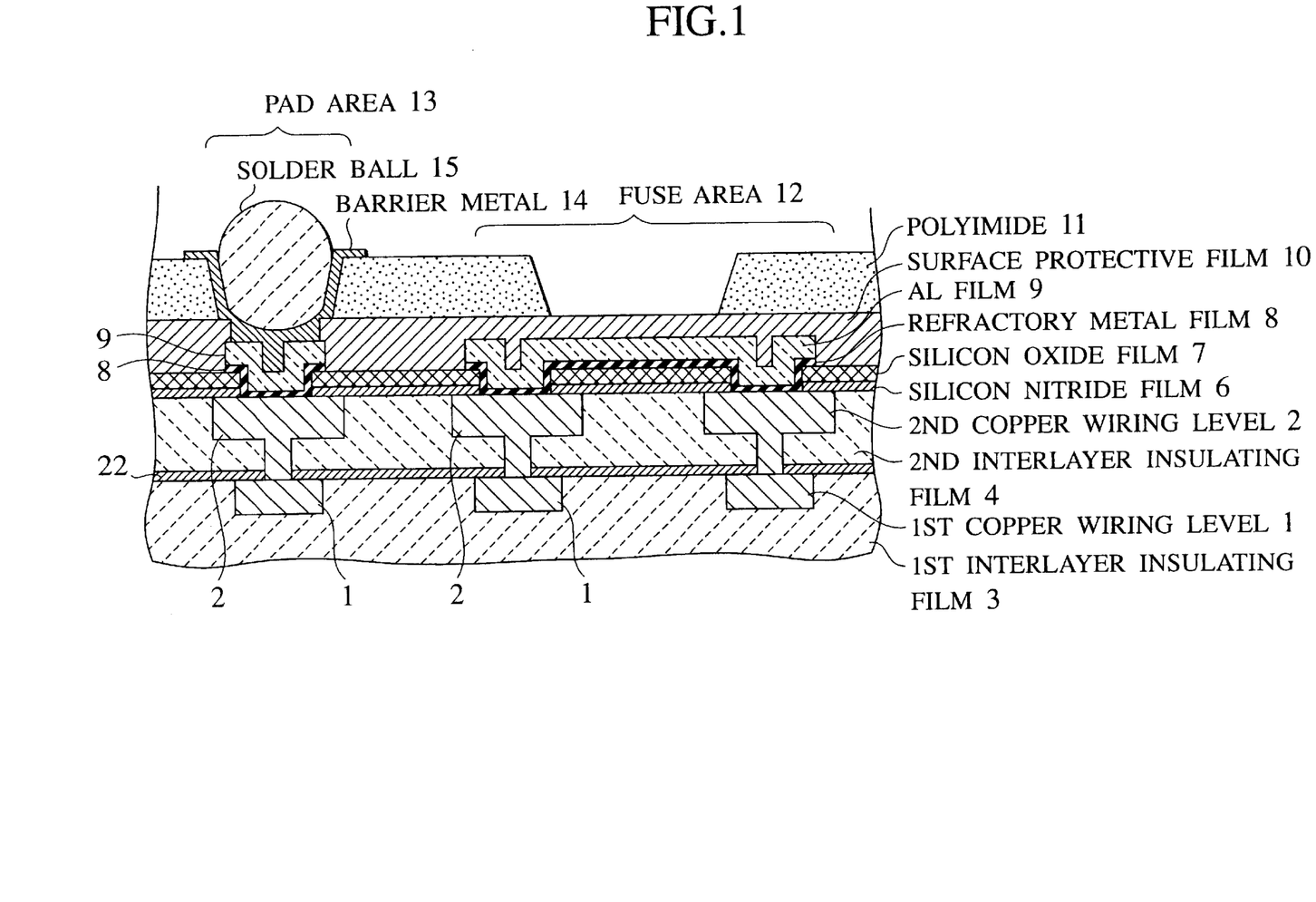
FIG. 1 is a sectional view showing part of a semiconductor device including a fuse according to an embodiment of the present invention.

FIG. 1 shows part of a semiconductor device according to an embodiment of the present invention. The semiconductor device has a semiconductor substrate, semiconductor elements formed on the semiconductor substrate, copper wiring levels 1 and 2 connecting the semiconductor elements to one another, an uppermost wiring level formed on the copper wiring levels 1 and 2 and including at least a refractory metal film 8 connected to the top copper wiring level 2, a fuse formed from a part of the uppermost wiring level, to be blown with an energy beam, a surface protective film 10 formed on the uppermost wiring level, an organic resin (polyimide) film 11 having a sufficiently large etching selection ratio with respect to the surface protective film 10, a bump base metal film (burrier metal film) 14 formed on the polyimide film 11 and connected to the uppermost wiring level, and a bump (solder ball) 15 formed on the barrier metal film 14. FIG. 1 shows only part of the semiconductor device of the embodiment, the part involving the copper wiring levels 1 and 2, uppermost wiring level, fuse, surface protective film 10, polyimide film 11, barrier metal film 14, solder ball 15, etc. The remaining part of the semiconductor device not shown in FIG. 1 involves like arrangements. Also not shown in FIG. 1 are the semiconductor substrate, semiconductor elements, etc., of the semiconductor device.

The copper wiring levels 1 and 2 are formed above the semiconductor substrate on which the semiconductor elements are formed, to connect the semiconductor elements to one another and form a semiconductor integrated circuit on the substrate. The copper wiring levels 1 and 2 are laid one upon another through interlayer insulating films 3 and 4. The copper wiring levels 1 and 2 are connected to each other through via contacts formed through the interlayer insulating films 3 and 4, to form the semiconductor integrated circuit having the multileveled wiring structure. The copper wiring levels 1 and 2 may be made of not only copper but also an alloy containing copper and other metals.

The uppermost wiring level is formed between the top copper wiring level 2 and the surface protective film 10 and at least includes the refractory metal film 8. The refractory metal film 8 suppress the diffusion of copper from the top copper wiring level 2. If the uppermost wiring level is provided with a multilayered structure, the refractory metal film 8 will be a bottom layer that is in contact with the top copper wiring level 2. The refractory metal film 8 may be made of titanium (Ti), tantalum (Ta), molybdenum (Mo), tungsten (W), or an alloy containing at least one of these metals. According to the embodiment, the upper most wiring level includes the refractory metal film 8 and an Al-based metal film 9.

A part of the uppermost wiring level forms an electrode pad. The electrode pad passes power to operate the semiconductor elements and signals to and from the semiconductor integrated circuit. If the electrode pad is subjected to wire bonding, it is preferable to form the Al-based metal film 9 to a thickness of about 500 nm on the refractory metal film 8. If the electrode pad is subjected to wireless bonding such as the flip-chip packaging, the uppermost wiring level may include only the refractory metal film 8.

The fuse is a circuit element forming a part of the semiconductor integrated circuit. According to the embodiment, the fuse is not a polysilicon of semiconductor element nor a part of the copper wiring. The fuse of the embodiment is a part of the uppermost wiring level. The fuse may be a part of a redundancy circuit that contains spare elements to be replaced with defective elements found in a semiconductor chip. The fuse may be a part of a semiconductor device that is intentionally blown with an energy beam after the completion of the semiconductor device.

The surface protective film 10 protects the functioning of the semiconductor chip and is formed by, for example, CVD. The surface protective film 10 is an insulating film formed on the fuse, and therefore, the thickness thereof is selected not to bother the blowing of the fuse. For example, the thickness of the surface protective film 10 may be selected in the range of 50 nm to 1000 nm.

The bump 15 is a protrusion electrode used for wireless bonding such as the flip-chip packaging and is connected to an electrode pad formed by selectively removing the surface protective film 10. The bump 15 may be made of an alloy containing at least one of tin (Sn), lead (Pb), and silver (Ag). According to the embodiment, the bump 15 is a solder ball.

The bump base metal film (barrier metal film) 14 is formed between the electrode pad and the bump 15, to improve contact between the electrode pad and the bump 15 and is made of a lamination of metal films such as titanium (Ti), chrome (Cr), copper (Cu), gold (Au), and nickel (Ni) films.

In FIG. 1, the copper wiring levels include the first and second copper wiring levels 1 and 2. Under the first copper wiring level 1, the first interlayer insulating film 3 is formed. Between the first and second copper wiring levels 1 and 2, the second interlayer insulating film 4 and a insulating film (SiN or SiC) 22 are formed. SiN and SiC 22 suppress the diffusion and corrosion of the first copper wiring level 1. The second copper wiring level 2 has a dual damascene structure. Namely, part of the second copper wiring level 2 forms contact plugs passing through the second interlayer insulating film 4, to connect the first and second copper wiring levels 1 and 2 to each other. In FIG. 1, the first and second copper wiring levels 1 and 2 include right, center, and left copper conductors. A fuse area 12 is defined between the right and center copper conductors, and a pad area 13 including the electrode pad is defined above the left copper conductor. Although not shown in FIG. 1, another copper wiring level is formed between the first copper wiring level 1 and the semiconductor substrate.

On the second copper wiring level 2, a silicon nitride film 6 is formed. On the silicon nitride film 6, a silicon oxide film 7 is formed. On the silicon oxide film 7, the refractory metal film 8 is formed. On the refractory metal film 8, the Al-based metal film 9 is formed. These films 8 and 9 form a multi-layered structure of the uppermost wiring level. The uppermost wiring level is selectively formed in the fuse area 12 and pad area 13. The refractory metal film 8 is connected to the right, center, and left copper conductors of the second copper wiring level 2. The center and right copper conductors of the second copper wiring level 2 in the fuse area 12 are connected to each other through the refractory metal film 8. On the Al-based metal film 9, the surface protective film 10 is formed. On the surface protective film 10, the polyimide film 11 is formed. On the Al-based metal film 9 in the pad area 13, the burrier metal film 14 is formed instead of the surface protective film 10 and polyimide film 11. The barrier metal film 14 is partly on the surface protective film 10 and polyimide film 11. On the barrier metal film 14, the solder ball 15 is formed. On the surface protective film 10 in the fuse area 12, there is no polyimide film 11, to thereby expose the surface protective film 10.

A method of manufacturing the semiconductor device of FIG. 1 will be explained with reference to FIGS. 2A to 4B that are sectional views showing principal stages of the method.

(1) A semiconductor wafer is set on a manufacturing line in a clean room, to prepare for substrate and wiring processes, and the manufacturing line is started. The substrate process forms semiconductor elements on the wafer. More precisely, film forming process, PEP process, etching process, etc., are repeated to form element isolation regions on the wafer, to isolate element areas from one another. In the element areas, semiconductor elements such as MOSFETs and bipolar transistors are formed.

(2) The wiring process carries out a damascene method to form a copper wiring level of copper conductors connected to the semiconductor elements, thereby forming a semiconductor integrated circuit. More precisely, an interlayer insulating film is formed on the semiconductor substrate. A resist pattern, having windows corresponding to electrodes of the semiconductor elements to be connected to copper conductors, is formed. The resist pattern is used to carry out anisotropic etching to selectively remove the interlayer insulating film at parts corresponding to the electrodes of the semiconductor elements. This forms contact holes to expose the electrodes of the semiconductor elements.

A spattering method is employed to bury a barrier layer, made of titanium (Ti) and titanium nitride (TiN), in the contact holes. A CVD method is employed to bury tungsten (W) in the contact holes. Excessive titanium, titanium nitride and tungsten on the interlayer insulating film is removed by, for example, CMP (chemical mechanical polishing), to form tungsten plugs selectively buried in the contact holes. Another interlayer insulating film is formed. A resist pattern having windows corresponding to wiring patterns is formed. The resist pattern is used to carry out anisotropic etching to selectively remove the interlayer insulating film at positions corresponding to the wiring patterns. This forms damascene wiring grooves to expose the tungsten plugs. A barrier layer, made of refractory metal such as tantalum (Ta) and tantalum nitride (TaN), is deposited on the inner walls of the damascene wiring grooves. A vacuum vapor deposition method or a plating method, for example, is used to deposit copper (Cu) in the damascene wiring grooves, to thereby fill back the grooves. The excessive refractory metal and Cu on the interlayer insulating film are removed by, for example, CMP, to form a copper wiring level with copper conductors. The copper conductors are made of the copper and refractory metal selectively buried in the damascene wiring grooves. These processes form the interlayer insulation film on the semiconductor substrate and the copper wiring level on the interlayer insulating film. On the copper wiring level, the SiN or SiC for suppressing diffusion and corrosion of the copper, is piled up.

These processes are repeated to alternately form an interlayer insulating film and a copper wiring level, to complete a multileveled wiring structure.

The tungsten plugs, connected to the semiconductor elements on the semiconductor substrate, are not formed on the second and other wiring levels that follow. Instead of the tungsten plugs, Cu and a refractory metal barrier layer are buried in contact holes and damascene wiring grooves, to form the second copper wiring level 2 of damascene structure, shown in FIG. 2A.

Figure 2A:
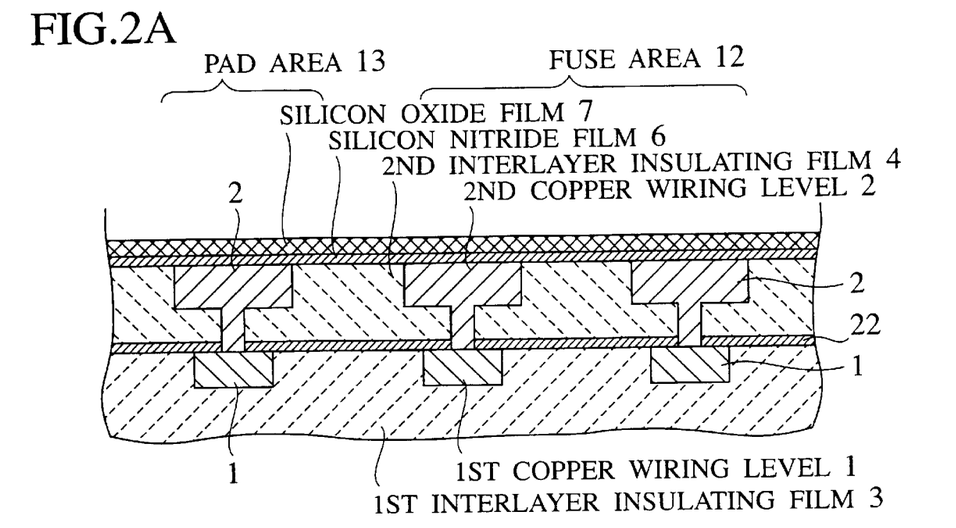
FIGS. 2A to 2C, 3A to 3C, 4A, and 4B are sectional views showing a method of manufacturing a semiconductor device according to an embodiment of the present invention.

(3) After forming the second copper wiring level 2, a silicon nitride film 6 of 100 nm thick is deposited on the whole surface of the wafer by CVD as shown in FIG. 2A. Thereafter, a silicon oxide film 7 of 400 nm thick is deposited by CVD. The silicon nitride insulating film 6 prevents copper from diffusing from the second copper wiring level 2. Instead of the silicon nitride film 6, an insulating film made of any other material, that provides the same function as the silicon nitride film 6, may be employed. According to the embodiment, the silicon nitride film 6, which is most commonly used, is deposited on the second copper wiring level 2.

Figure 2B:
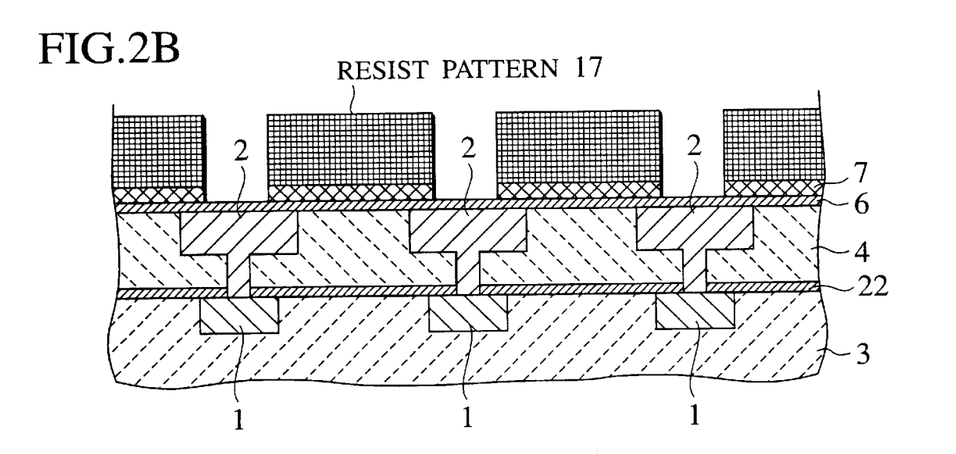

(4) A spinner is employed to spin the wafer, and a resist liquid is applied to the spinning wafer, to form a uniform resist film on the silicon oxide film 7. The resist film is exposed to light through a mask having windows corresponding to the right, center, and left conductors of the second copper wiring level 2. The resist film is developed, to form a resist pattern 17 having openings corresponding to the right, center, and left conductors as shown in FIG. 2B. The resist pattern 17 is used as a mask to anisotropically etch the silicon oxide film 7 by RIE. This selectively removes the silicon oxide film 7 and partly exposes the silicon nitride film 6. The resist pattern 17 is removed by ashing.

Figure 2C:
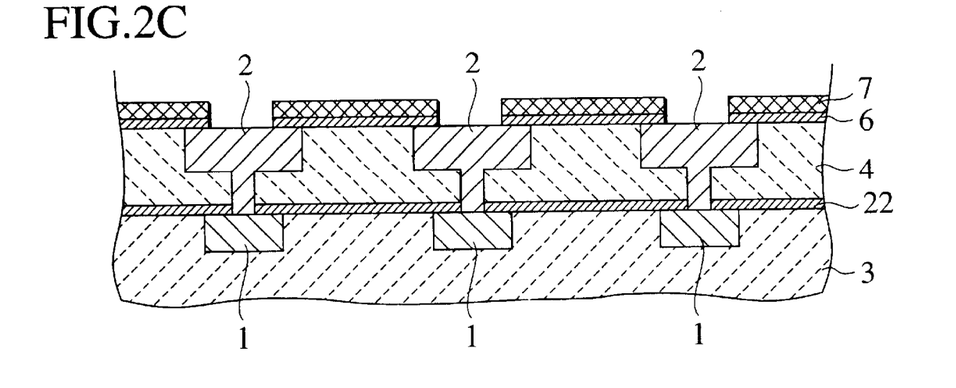

(5) In FIG. 2C, the silicon oxide film 7 is used as a mask to anisotropically etch the silicon nitride film 6. This selectively removes the silicon nitride film 6 and partly expose the second copper wiring level 2. If the resist pattern 17 is used to simultaneously etch the silicon oxide film 7 and silicon nitride film 6, the exposed second copper wiring level 2 may also be oxidized when the resist pattern 17 is removed by ashing. This must be avoided to maintain proper electric characteristics. To avoid the oxidization of the second copper wiring level 2, two insulating films such as the silicon oxide film 7 and silicon nitride film 6, having sufficiently large etching selectivity, are used. Any other combination of two insulating films, having sufficiently large etching selectivity, may be employable. If the method, used to remove the resist pattern 17, causes no oxidization of the exposed copper wiring level 2, a single interlayer insulating film will be acceptable to be formed on the second copper wiring level 2. In this case, the single insulating film is etched at one time. Any one of these techniques is employable to provide the effect of the embodiment.

Figure 3A:
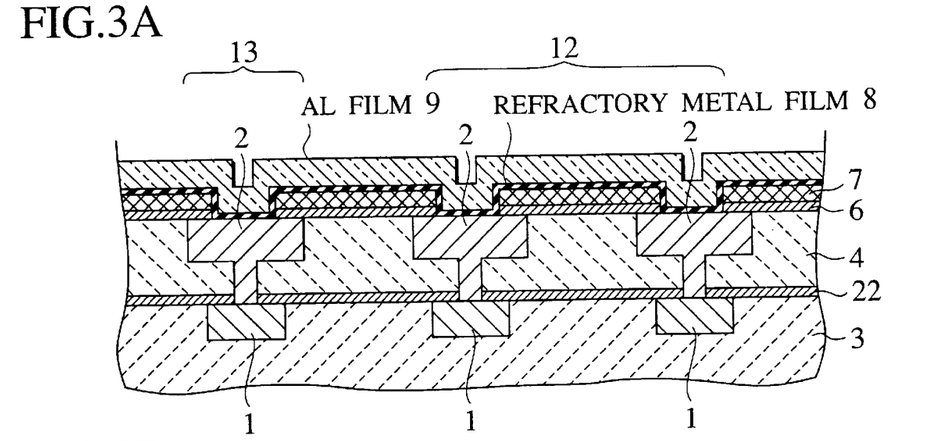

(6) In FIG. 3A, a refractory metal film 8 is deposited by spattering. The refractory metal film 8 may have a multi-layered structure or a single layer structure of tantrum (Ta) or tantrum nitride (TaN). According to the embodiment, the refractory metal film 8 is made by depositing TaN of 10 to 60 nm thick, and on which, Ta of 5 to 20 nm thick. On the refractory metal film 8, an Al-based film 9 of 500 nm thick is deposited by spattering, to complete an uppermost wiring level made of the refractory metal film 8 and Al-based metal film 9. The thickness of the Al-based metal film 9 is set to satisfy resistance specifications for a fuse and enable the fuse to be blown with a laser beam. The Al-based metal film 9 may be an AlCu film containing Al and Cu of several wt %, or an AlSiCu film containing Al, Cu of several wt %, and silicon (Si) of several wt %. According to the embodiment, the film 9 is made of only aluminum of about 500 nm thick, to deal with wire bonding. The film thickness of aluminum may be changed, if it is necessary. If no wire bonding is expected and if only wireless bonding with the use of the solder ball 15 is expected, the uppermost wiring level may consist only of the refractory metal film 8. According to the embodiment, the Al film 9 is formed so that a conventional solder bump process on Al wiring may be carried out.

Figure 3B:
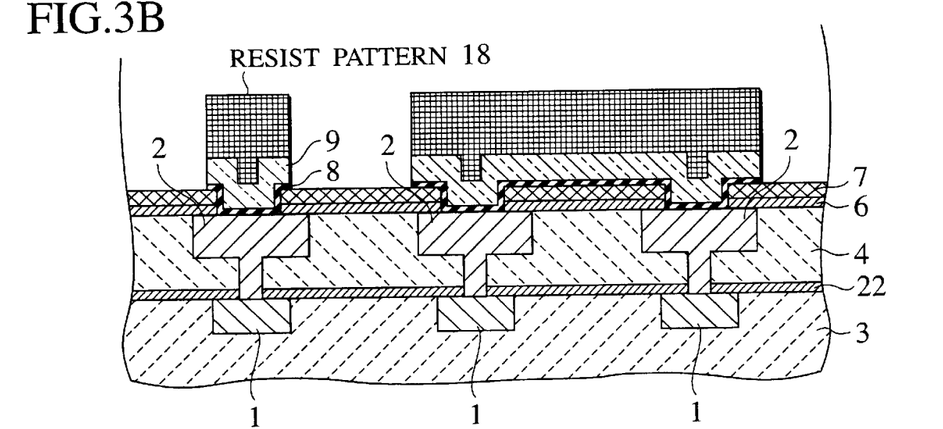

(7) A spinner is used to spin the wafer, and a resist liquid is applied to the spinning wafer to form a uniform resist film on the Al film 9. A predetermined mask is used to expose the resist film to light and develop the resist mask. This selectively forms a resist pattern 18 on a fuse area 12 and a pad area 13 as shown in FIG. 3B. The resist pattern 18 is used as a mask to anisotropically etch the Al film 9 and refractory metal film 8 by RIE. This selectively removes the Al film 9 and refractory metal film 8 excluding the fuse area 12 and pad area 13. The resist pattern 18 is removed by ashing. Instead of RIE, i.e., dry etching, wet etching may be employed to selectively remove the Al film 9 and refractory metal film 8. The effect of the embodiment will be unchanged irrespective of the type of etching carried out on the uppermost wiring level.

Figure 3C:
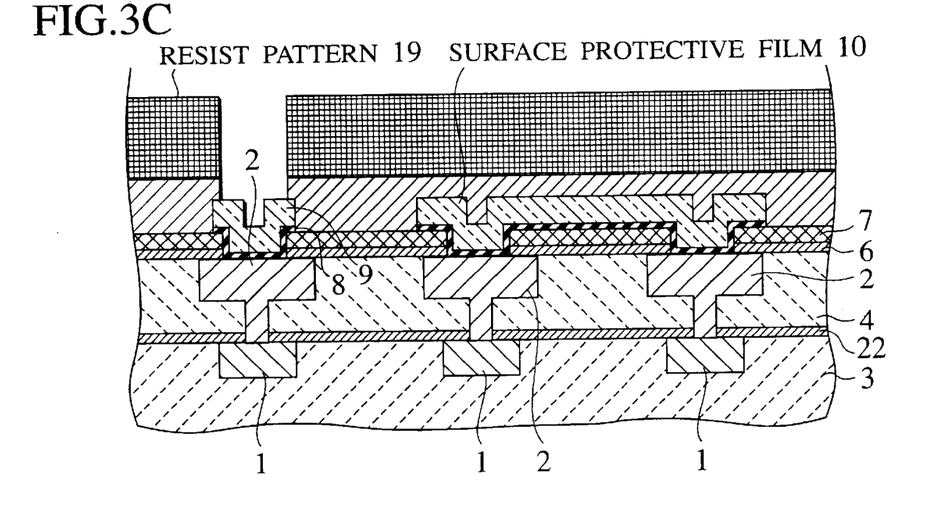

(8) In FIG. 3C, a surface protective film 10 is deposited by, for example, CVD. The surface protective film 10 is a standard one formed on an Al wiring level. For example, the surface protective film 10 is a silicon nitride film, or a multilayered structure of a silicon nitride film and a silicon oxide film. To cope with the use of an acid etching liquid in a solder bump forming process, the embodiment forms the surface protective film 10 by depositing a silicon oxide film of about 300 nm thick. On the silicon oxide film, a silicon nitride film of about 200 nm thick, having an acid resistant property, is formed. If the surface protective film 10 is made of a single silicon nitride film, it may produce stress to break the Al film 9 of the uppermost wiring level. To absorb the stress of the silicon nitride film, the silicon oxide film is deposited on the Al film 9, and then, the silicon nitride film is deposited. If a silicon nitride film producing small stress is employed, the silicon nitride film may solely be used to form the surface protective film 10.

The thickness of the surface protective film 10 is set to properly blow the fuse. When blowing the fuse with a laser beam, it is usual to form an insulating film of 1000 nm or thinner on the fuse. If the uppermost wiring level serving as the fuse is exposed, the fuse will corrode or be contaminated. To protect the functioning of the semiconductor integrated circuit, the surface protective film 10 must be 50 nm or thicker. Namely, the thickness of the surface protective film 10 is selected in the range of 50 nm to 1000 nm. According to the embodiment, the combined thickness of the silicon nitride film and silicon oxide film is 500 nm. In this way, the embodiment determines the thickness of the insulating film on the fuse by controlling a film deposition thickness. The related art forms a fuse in a lower wiring level and selectively thins an insulating film on the fuse. Compared with the above related art, the embodiment minimizes thickness variations in the insulating film on the fuse, to realize the stable blowing of the fuse.

(9) A spinner is used to spin the wafer, and a resist liquid is applied to the spinning wafer to form a uniform resist film on the surface protective film 10. A predetermined mask is used to expose the resist film to light. The resist film is developed to form a resist pattern 19 having a window corresponding to the pad area 13 as shown in FIG. 3C. The resist pattern 19 is used as a mask to carry out dry or wet etching to selectively remove the surface protective film 10 from the pad area 13. This exposes the Al film 9 in the pad area 13. The resist pattern 19 is removed by ashing.

Figure 4A:
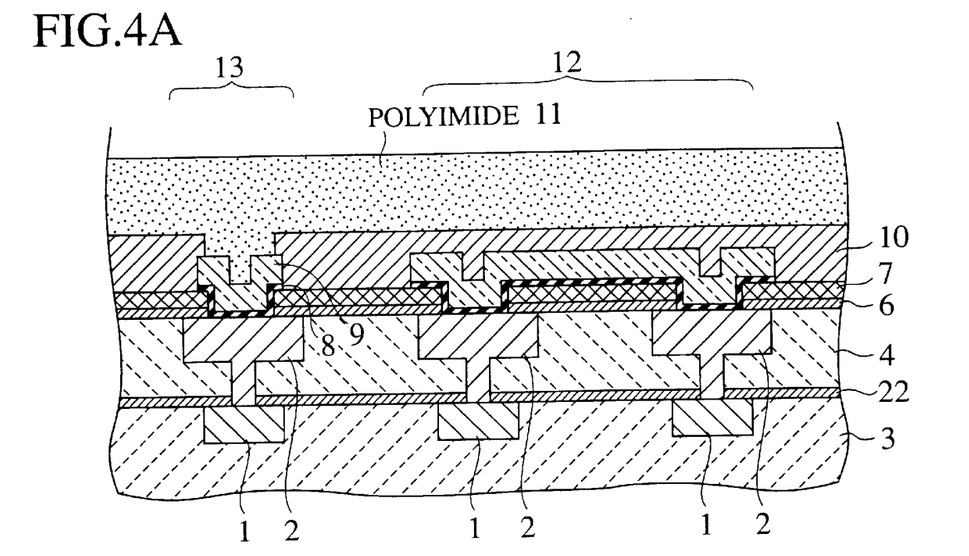
Figure 4B:
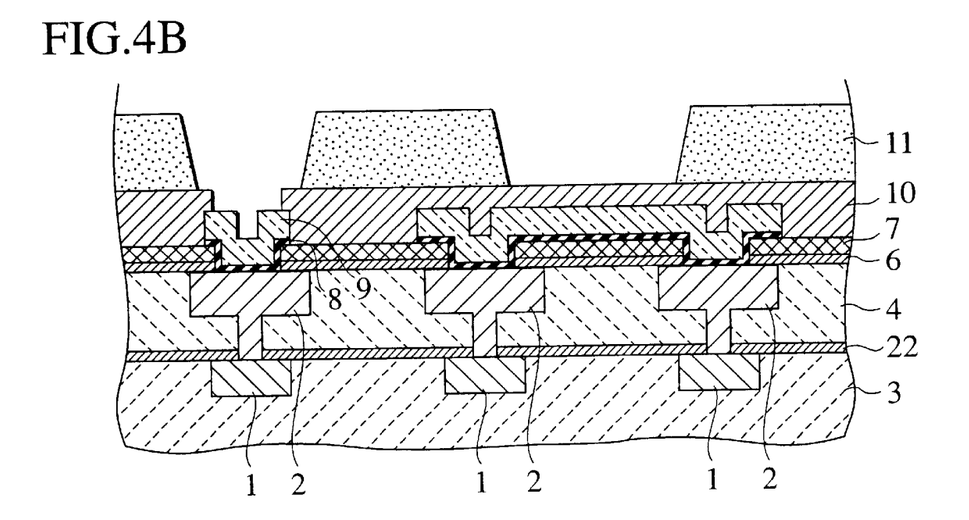

(10) In FIG. 4A, a polyimide film 11 is deposited on the surface protective film 10, to improve reliability. The polyimide film 11 is not always necessary. The polyimide film 11 may be a photosensitive one or a not-photosensitive one, as required. According to the embodiment, the polyimide film 11 is photosensitive because it simplifies related processes. In FIG. 4B, a standard lithography process is carried out to selectively remove the polyimide film 11 from the fuse area 12 and pad area 13. In this way, the surface protective film 10 in the fuse area 12 and the Al film 9 in the pad area 13 are exposed selectively. The surface protective film 10 has a sufficient etching selection ratio with respect to the polyimide film 11. Therefore, the etching may be terminated when the surface protective film 10 is exposed. Namely, the polyimide film 11 may easily be removed from the fuse area 12, to expose the surface protective film 10.

Generally, the processes (1) to (10) mentioned above are consecutively carried out in a single wafer manufacturing line. Each semiconductor wafer, processed through these processes, is tested in a wafer testing process. If the wafer is for semiconductor memories, a probe is applied to each electrode pad (the Al film 9 in the pad area 13) of each chip on the wafer, to test the operation of each memory cell of the chip. If any chip having a defective memory cell is found in the test, the fuse (the uppermost wiring level in the fuse area 12) of a redundancy circuit is blown with a laser beam, to replace the defective memory cell with a spare memory cell. In this way, the chip having the defective memory cell may be repaired. Each wafer, completed the operation test, is again subjected to the probe test. Any defective chip that is unrepairable even with the redundancy circuit is provided with a fail mark. Each semiconductor wafer is taken out of the wafer manufacturing line. Each acceptable chip, passed through the operation test, is transferred to a manufacturing line that involves an assembling process mentioned below.

(11) Each acceptable chip passed through the operation test is subjected to a solder bump forming process. The solder bump forming process forms a barrier metal film 14 and solder balls 15. Then, the semiconductor device of FIG. 1 is completed.

The embodiment forms only the surface protective film 10 on the uppermost wiring level in which the fuse is formed. Accordingly, there is no need of thinning the insulating film on the fuse, to properly blow the fuse. Without such laborious work of thinning an insulating film, the fuse of the embodiment is easy to form and blow. According to the embodiment, the copper wiring levels 1 and 2 are not used to form the fuse. Therefore, the interlayer insulating films 3 and 4 on the copper wiring levels 1 and 2 also may be left as they are, without being thinned for the convenience of blowing the fuse. The protective film 10 is formed to cover the fuse, so that the fuse may not corrode and so that impurity ions may not penetrate the fuse to deteriorate the characteristics thereof.

The embodiment eliminates an etching process to control the thickness of the insulating film on the fuse. This improves productivity and decreases manufacturing costs. The embodiment carries out no side etching when patterning the fuse by isotropic etching, to thereby expand the degree of freedom of designing. The freedom of designing includes, for example, the width of a blowing part of the fuse. The embodiment forms the fuse as a part of the uppermost wiring level, before forming the barrier metal film (bump base metal film) 14 and solder ball 15. Accordingly, the manufacturing line involving the wiring process carries out an operation test on each semiconductor chip and replaces any defective part with a spare element by blowing the fuse. Only acceptable chips passed through the operation test are processed through the barrier metal film forming process, bump forming process, and other assembling processes, to improve productivity.

In this way, the embodiment of the present invention provides a semiconductor device having a fuse that is easy to blow and an insulating film whose thickness is easy to control on the fuse. Also provided is a method of manufacturing such a semiconductor device.

The embodiment of the present invention also provides a semiconductor device and a method of manufacturing the semiconductor device having a fuse. The fuse is producible in a wafer process including substrate and wiring processes and is easy to blow.

Figure 5:
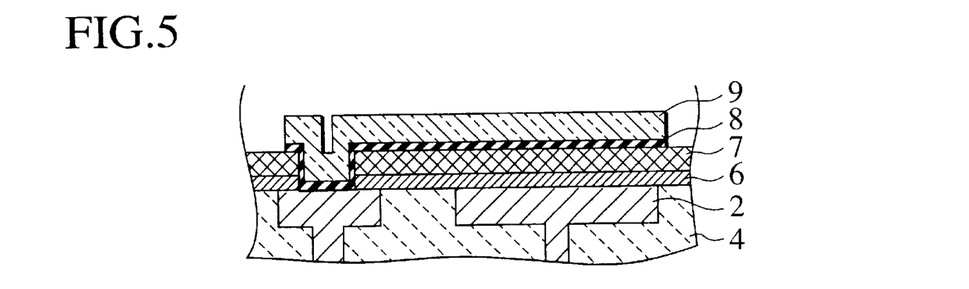
FIG. 5 is a sectional view showing a capacitor formed between an uppermost wiring level and a top copper wiring level in a semiconductor device according to an embodiment of the present invention.

According to an embodiment of the present invention, the uppermost wiring level and the second copper wiring level 2 may form a capacitor as shown in FIG. 5. In this case, the uppermost wiring level and second copper wiring level 2 serve as parallel flat electrodes. Then, an electric field is formed in the silicon nitride film 6 and silicon oxide film 7. This capacitor is formed without increasing the number of manufacturing processes and is effective to stabilize a source voltage supplied to the whole of the device.

Figure 6:
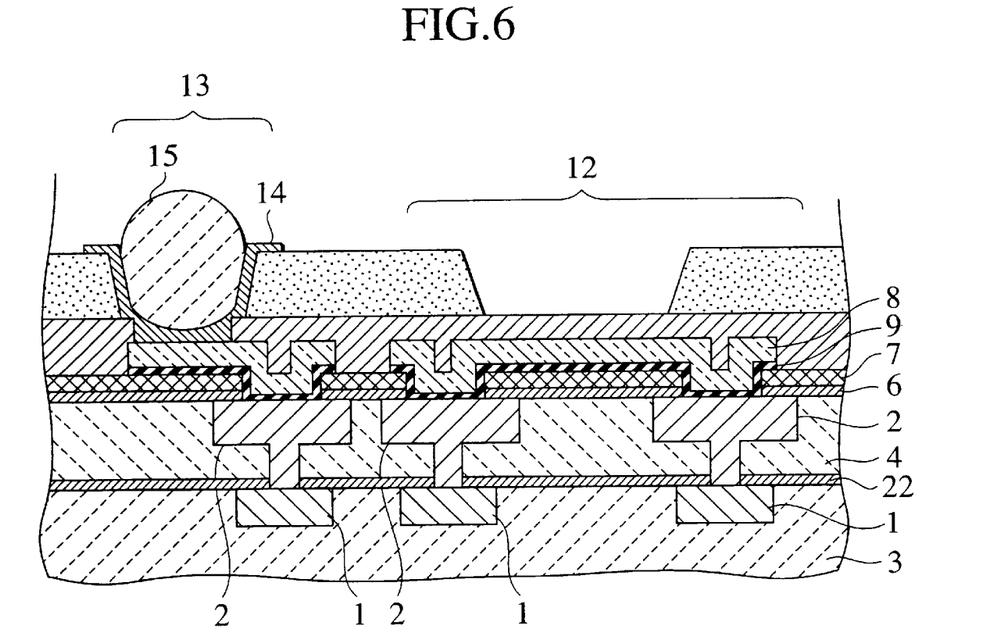
FIG. 6 is a sectional view showing a semiconductor device according to an embodiment of the present invention, a barrier metal film and solder ball of this embodiment being positioned differently from those of the embodiment of FIG. 1.

According to an embodiment of the present invention, the pad area 13 may be formed at an optional location on the semiconductor chip. The pad area 13 may be formed in the periphery of the chip where no semiconductor elements are present. Alternatively, the pad area 13 may be formed above an element area where semiconductor elements are present. The pad area 13 according to the embodiment is capable of coping with the flip-chip packaging using protrusion electrodes (bumps) and multiple pins. According to an embodiment of the present invention, the barrier metal film 14 and solder ball 15 may be formed above semiconductor elements. In FIG. 6, the pad area 13 including the barrier metal film 14 and solder ball 15 is arranged at a location. The location is not just above a connection between the second copper wiring level 2 and the refractory metal film 8.

Figure 7A:
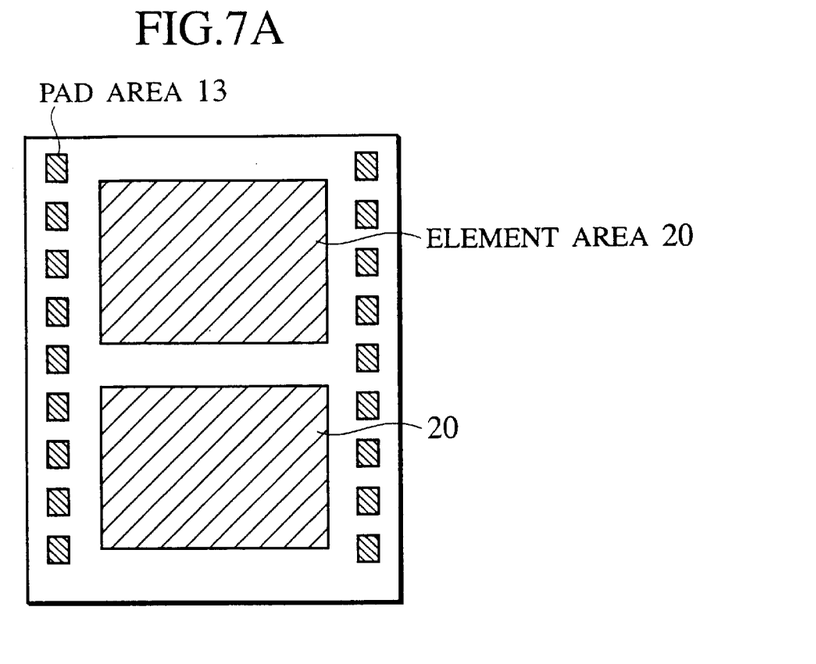
FIG. 7A is a plan view showing a layout of element and pad areas on a semiconductor chip according to a related art.
Figure 7B:
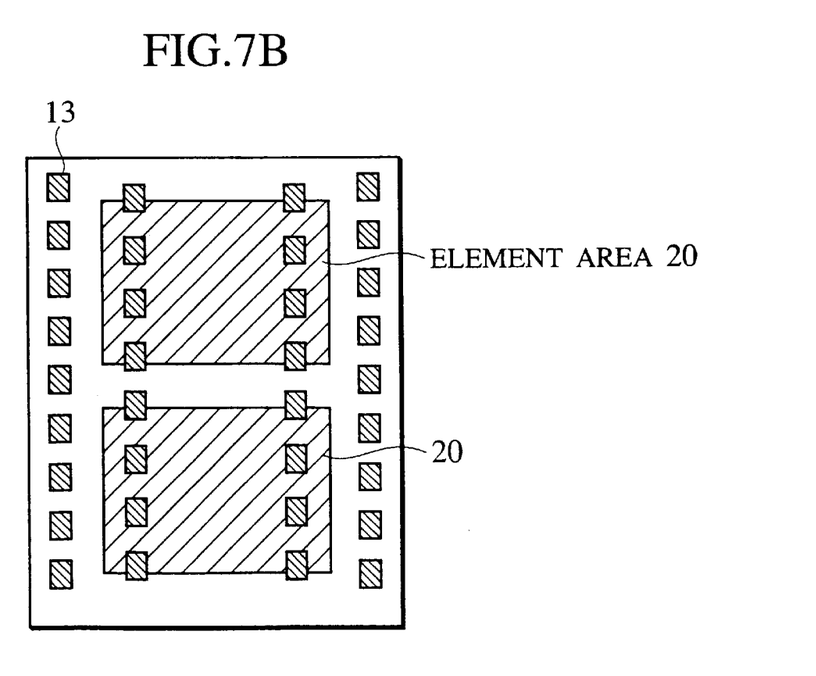
FIG. 7B is a plan view showing a layout of element and pad areas on a semiconductor chip according to an embodiment of the present invention.

According to an embodiment of the present invention, the uppermost wiring level may be used to arrange the pad area 13 at an optional location on the semiconductor chip. FIG. 7A shows a layout of a semiconductor chip according to a related art. FIG. 7B shows a layout of a semiconductor chip according to an embodiment of the present invention. In FIG. 7A, the related art arranges an element area at the center of the chip, and each pad area 13 at the periphery of the chip. In FIG. 7B, the embodiment employs the uppermost wiring level to arrange the barrier metal film 14 and solder ball 15, i.e., the pad area 13 at an optional location on the semiconductor chip. As a result, the embodiment is applicable to wireless bonding such as the flip-chip packaging and high-density packaging involving multiple pins.

The semiconductor device of the embodiment is embodied as a static random access memory (SRAM).

Although the present invention has been explained with reference to the embodiments, the embodiments mentioned above and the accompanying drawings are not intended to limit the present invention.

Additional advantages and modifications of the present invention will readily occur to those skilled in the art. Therefore, the present invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor device comprising:
   copper wiring layers formed above a semiconductor substrate on which semiconductor elements are formed;
   a first insulating film formed on a top one of said copper wiring layers;
   a second insulating film formed on said first insulating film;
   an uppermost wiring layer formed on said second insulating film, and including a refractory metal film connected to the top one of said copper wiring layers;
   a fuse formed from a part of said uppermost wiring layer; and
   a surface protective film formed on said uppermost wiring layer.

2. The semiconductor device of claim 1, further comprising:
   a bump base metal film formed on said surface protective film and connected to said uppermost wiring layer; and
   a bump formed on said bump base metal film.

3. The semiconductor device of claim 2, wherein said bump base metal film and said bump are formed above said semiconductor elements.

4. The semiconductor device of claim 1, further comprising a capacitor formed with said uppermost wiring layer and the top one of said copper wiring layers.

5. The semiconductor device of claim 1, wherein said uppermost wiring layer includes an Al-based metal film formed on said refractory metal film.

6. The semiconductor device of claim 1, wherein said surface protective film has a thickness that causes no hindrance in blowing said fuse.

7. The semiconductor device of claim 1, wherein at least part of said copper wiring layers has a dual damascene structure.

8. The semiconductor device of claim 1, comprising a static random access memory.

9. The semiconductor device of claim 1, wherein said fuse is capable of being blown with an energy beam.

10. The semiconductor device of claim 1, wherein said surface protective film includes a first protective film formed on said uppermost wiring layer and a second protective film formed on said first protective film.

11. A method of manufacturing a semiconductor device, comprising:
    forming copper wiring layers on interlayer insulating films, respectively, above a semiconductor substrate on which semiconductor elements are formed;
    forming a first insulating film on a top one of said copper wiring layers;
    forming a second insulating film on said first insulating film;
    forming, on said second insulating film, an uppermost wiring layer including a refractory metal film connected to the top one of said copper wiring layers;
    forming a fuse from a part of said uppermost wiring layer; and
    forming a surface protective film on said uppermost wiring layer.

12. The method of claim 11, further comprising:
    forming a bump base metal film on said surface protective film, said bump base metal film being connected to said uppermost wiring layer; and
    forming a bump on said bump base metal film.

13. The method of claim 12, wherein said bump base metal film and said bump are formed above said semiconductor elements.

14. The method of claim 11, further comprising:
    forming a first electrode of a capacitor from a part of the top one of said copper wiring layers; and
    forming a second electrode of said capacitor from a part of said uppermost wiring layer.

15. The method of claim 11, further comprising forming an Al-based metal film on said refractory metal film, said Al-based metal film and refractory metal film constituting said uppermost wiring layer.

16. The method of claim 11, wherein said surface protective film is formed to a thickness of 50 nm to 1000 nm.

17. The method of claim 11, wherein at least part of said copper wiring layers are formed by a damascene method.

18. The method of claim 11, wherein said fuse is capable of being blown with an energy beam.

19. The method of claim 11, wherein said forming a surface protective film on said uppermost wiring layer comprises:
    forming a first protective film on said uppermost wiring layer; and
    forming a second protective film on said first protective film.

20. A semiconductor device comprising:
    copper wiring layers formed above a semiconductor substrate on which semiconductor elements are formed;
    a first insulating film formed on a top one of said copper wiring layers;
    a second insulating film formed on said first insulating film;
    an uppermost wiring layer formed on said second insulating film, and including a refractory metal film connected to the top one of said copper wiring layers and an Al-based metal film formed on said refractory metal film;
    a fuse formed from a part of said uppermost wiring layer;
    a surface protective film including a first protective film formed on said uppermost wiring layer and a second protective film formed on said first protective film; and
    an organic resin film formed on said surface protective film.

21. The semiconductor device of claim 20, further comprising:
- a bump base metal film formed on said organic resin film and connected to said uppermost wiring layer; and
- a bump formed on said bump base metal film.

22. The semiconductor device of claim 21, wherein said bump base metal film and said bump are formed above said semiconductor elements.

23. The semiconductor device of claim 20, further comprising a capacitor formed with said uppermost wiring layer and the top one of said copper wiring layers.

24. The semiconductor device of claim 20, wherein said surface protective film has a thickness that causes no hindrance in blowing said fuse.

25. The semiconductor device of claim 20, wherein at least part of said copper wiring layers has a dual damascene structure.

26. The semiconductor device of claim 20, wherein said fuse is capable of being blown with an energy beam.

* * * * *